(12) United States Patent
Huet et al.

(10) Patent No.: US 11,322,358 B2
(45) Date of Patent: May 3, 2022

(54) METHOD OF LASER IRRADIATION OF A PATTERNED SEMICONDUCTOR DEVICE

(71) Applicant: LASER SYSTEMS & SOLUTIONS OF EUROPE, Gennevilliers (FR)

(72) Inventors: Karim Huet, Gennevilliers (FR); Fulvio Mazzamuto, Gennevilliers (FR); Cyril Dutems, Gennevilliers (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 19 days.

(21) Appl. No.: 16/963,147

(22) PCT Filed: Jan. 14, 2019

(86) PCT No.: PCT/EP2019/050839
§ 371 (c)(1),
(2) Date: Jul. 17, 2020

(87) PCT Pub. No.: WO2019/141635
PCT Pub. Date: Jul. 25, 2019

(65) Prior Publication Data
US 2021/0125831 A1    Apr. 29, 2021

(30) Foreign Application Priority Data

Jan. 18, 2018  (EP) .................................... 18305036

(51) Int. Cl.
*H01L 21/00* (2006.01)
*H01L 21/268* (2006.01)
(Continued)

(52) U.S. Cl.
CPC .......... *H01L 21/268* (2013.01); *B23K 26/064* (2015.10); *B23K 26/067* (2013.01);
(Continued)

(58) Field of Classification Search
CPC . H01L 21/268; B23K 26/0622; B23K 26/064; B23K 26/067; G02B 27/286; G01N 21/956
(Continued)

(56) References Cited

U.S. PATENT DOCUMENTS

| 7,786,024 B2 | 8/2010 | Stumbo et al. |
| 2005/0128462 A1* | 6/2005 | Matsui ................ G03F 7/70783 355/72 |

(Continued)

OTHER PUBLICATIONS

International Search Report and Written Opinion, dated Apr. 8, 2019, from corresponding PCT application No. PCT/EP2019/050839.

(Continued)

*Primary Examiner* — Brook Kebede
(74) *Attorney, Agent, or Firm* — Nixon & Vanderhye

(57) ABSTRACT

Disclosed is a method of laser irradiation of a patterned semiconductor device including a periodic array of sub-wavelength fin-like structures, all fin-like structures upstanding from a base face of the semiconductor device and defining an upper face of the periodic array opposite the base face, each fin-like structure having: a width along a first direction parallel to the base face of the order of magnitude or smaller than the laser wavelength; a length along a second direction parallel to the base face and perpendicular to the first direction at least 3 times greater than the width; and a height along a third direction perpendicular to the base face. The method includes: generating a UV pulsed laser beam using a laser module; and irradiating at least a portion of the upper face with the laser beam.

20 Claims, 5 Drawing Sheets

(51) Int. Cl.
*B23K 26/0622* (2014.01)
*B23K 26/064* (2014.01)
*B23K 26/067* (2006.01)
*G02B 27/28* (2006.01)
*B23K 101/40* (2006.01)

(52) U.S. Cl.
CPC ........ *B23K 26/0622* (2015.10); *G02B 27/286* (2013.01); *B23K 2101/40* (2018.08)

(58) Field of Classification Search
USPC .......................................................... 438/795
See application file for complete search history.

(56) References Cited

U.S. PATENT DOCUMENTS

2006/0083420 A1* 4/2006 Kawaguchi ............... G06T 5/40
382/149
2017/0178910 A1 6/2017 Vandervorst

OTHER PUBLICATIONS

Hernandez, M. et al., "Laser thermal processing using an optical coating for ultra shallow junction formation," Materials Science and Engineering B 114-115 (2004) 105-108.

* cited by examiner

| ITEM | DIMENSION nm |
|---|---|
| FIN TOP HEIGHT | 20.00 |
| FIN TOP WIDTH | 5.00 |
| FIN BOTTOM WIDTH | 20.00 |
| FIN BOTTOM HEIGHT | 60.00 |
| PITCH | 45.00 |
| FIN BOTTOM SUBSTRATE ROUNDING | 6.00 |

(wave map, clear is high coupling, dark is low coupling)

METHOD OF LASER IRRADIATION OF A PATTERNED SEMICONDUCTOR DEVICE

TECHNICAL FIELD OF THE INVENTION

The present invention relates, in general, to a method for annealing a patterned semiconductor device to locally modify electrical or structural properties of a selected set of structures (or layers) without impacting the remaining structures of the semiconductor device.

More specifically, the invention concerns a method of laser irradiation, typically an UV laser beam, of selected structures, in particular fin-like structures of a semi-conductor device without impacting other structures of the semi-conductor device such as the gates.

BACKGROUND INFORMATION AND PRIOR ART

In such-10 nm semiconductor technology, the device structures are very fragile. For example, outstanding fin-like structures are easily subject to structural damage during various steps of the manufacturing process. Moreover, at some steps, the gates, a fragile set of layers perpendicular to the fin structures usually made of low temperature materials (such as metal or polysilicon) are also present. In the specific case of annealing, it is necessary to reach very high temperatures specifically in the fin region without unwanted side effects such as fin damage, gate damage, species diffusion in the gate region, excess species diffusion in the fin region. Traditionally, the solutions are to use short timescale processes such as millisecond annealing or sub-µs laser annealing. However, in these cases, the heating location is not well controlled, only limited by the thermal diffusion length, from full wafer thickness in the case of millisecond annealing to micro-meter scale in the case of sub-microsecond annealing with short wavelength (e.g. UV). The latter case allows selective annealing of surface layers without impacting buried layers but the location of the heat on patterned structures is not controlled, which means that all structures on the surface layer will be heated in a non-controlled way.

The aim of the invention is to be able to generate heat selectively in a given layer (for example the base structure of the fin) and not in another (for example to outstanding fin and the gate regions). The generated heat would then diffuse from this targeted region thus minimizing the unwanted side effects.

A known solution to the above problem is the use of antireflective coating and/or absorber layers with various optical properties to reflect light in the unwanted regions and absorb or transmit the light in the wanted regions.

Thus, Mr. Hernandez et al. in article "*Laser thermal processing using an optical coating for ultra-shallow junction formation*", Materials Science and Engineering B114-115 (2004) 105-108 disclose covering the gate source/drain region by an optical coating to optimize electromagnetic diffusion for laser thermal processing. The optical coating shall maximize the laser light reflection on top of the gate.

However, the above disclosed solution has several drawbacks. First, it adds several steps to the process, thus impacting cost and yield. Secondly, this coating approach is much less efficient in the case of structures with typical dimensions which are in the range of the laser wavelength due to waveguide-like electromagnetic coupling effects (diffraction and interferences).

U.S. Pat. No. 7,786,024 discloses a method for annealing semiconductor nanowires which comprises applying a polarized laser beam to the doped nanowires.

The polarization of the laser beam may be configured to modify an absorption by the nanowires of radiation of the applied laser beam.

For example, the laser beam may be circularly polarized, polarized in a direction substantially parallel to the axis, or substantially perpendicular to the axis to modify the absorption.

In one aspect, the polarized laser annealing may be performed in a manner to anneal the semiconductor nanowires, without causing damage to the semiconductor nanowires and substrate.

In another aspect, the polarized laser annealing may be performed in a manner to melt or ablate particular nanowires. For example, nanowires aligned substantially perpendicularly to the polarization of the laser beam may be retained, while nanowires having other alignments, such as parallel to the polarization of the laser beam, are melted or ablated.

However, U.S. Pat. No. 7,786,024 does not address generating heat selectively in a given layer (for example the base region) and not in another layer (the outstanding region) of a fin-like structure.

SUMMARY OF THE INVENTION

Thus the present invention provides a method of laser irradiation of a patterned semiconductor device comprising a periodic array of sub-wavelength fin-like structures, all fin-like structures upstanding from a base face of said semiconductor device and defining an upper face of said periodic array opposite to said base face, each fin-like structure having:

a width along a first direction parallel to said base face, said width being of the order of magnitude or smaller than the laser wavelength;

a length along a second direction parallel to said base face and perpendicular to said first direction, said length being at least 3 times greater, preferably 5 times greater and more preferably 10 times greater than said width; and a height along a third direction perpendicular to said base face;

said method of laser irradiation comprising the steps of:

generating a UV pulsed laser beam by means of a laser module;

irradiating at least a portion of said upper face of the periodic array of fin-like structures with said laser beam, wherein the method comprises imparting a controlled state of polarization to said laser beam so as to selectively control the amount of energy of the laser beam coupled locally to each fin-like structure along the third direction.

Preferably, said controlled state of polarization imparted to the laser beam is determined so as to further control a gradient of heat diffusion along the third direction, in amplitude and/or direction, within each fin-like structure.

In a preferred embodiment, the controlled state of polarization imparted to the laser beam is determined according to pitch of the periodic array of the fin-like structures. The pitch is typically lower than the wavelength of the UV laser beam (≤355 nm). In general, the pitch (fin-to-fin period) of the fin-like structure ranges from 10 to 300 nm, preferably from 40 to 275 nm.

The controlled state of polarization imparted to the laser beam can be linear, circular, elliptical, unpolarized or a combination thereof.

The laser beam is generally irradiated perpendicularly to the upper face of the periodic array.

The controlled state of polarization imparted to the laser beam comprises a first polarization along the first direction and/or a second polarization along the second direction.

The pulsed UV laser beam has a wavelength equal to or lower than 355 nm and preferably of 308 nm and the pulse duration is typically below 200 ns, generally ranging from 20 to 200 ns.

In a preferred embodiment, the laser beam is homogenized prior to irradiation of the semiconductor device with a homogenous laser fluence.

In general, the fluence of the laser beam on the upper face of the periodic array is greater than 1 joule per square meter.

The method of the invention may also comprise a step of shaping the laser beam so as to form an irradiation area matching the size and shape of the overall semiconductor device.

The laser module is typically an excimer laser module, preferably a xenon-chloride laser module.

DETAILED DESCRIPTION OF EXAMPLES

The description below is made with reference to the accompanying drawings in which:

FIG. 1 is a three-dimensional schematic representation of a field effect transistor device with fin-like structures according to the invention and irradiated by laser light with full transverse electric mode (TE mode) along the length (first direction) of the fin-like structure and full transverse magnetic mode (TM mode) across the length of the fin-like structure, i.e. along the width of the fin-like structure (second direction);

The method according to the invention uses the specificity of sub-10 nm node technologies that all the active fin-like structures are oriented in a given direction due to patterning requirements.

In a dense array of periodic structures, polarized laser light can be selectively transmitted or reflected depending on the orientation of the structures relatively to the light polarization.

Considering materials for which the absorption is very high (<10 nm absorption length, or absorption coefficient >$10^6$ cm$^{-1}$, which is case for UV wavelength in silicon), all the light is absorbed within the thickness of the typical active layers or a fraction of it. The heat generation is therefore confined to such layer.

Considering a pulsed laser with short enough pulse duration (<200 ns), the diffusion of this heat can be restrained in space to the typical dimensions of the layers.

Figure 1:
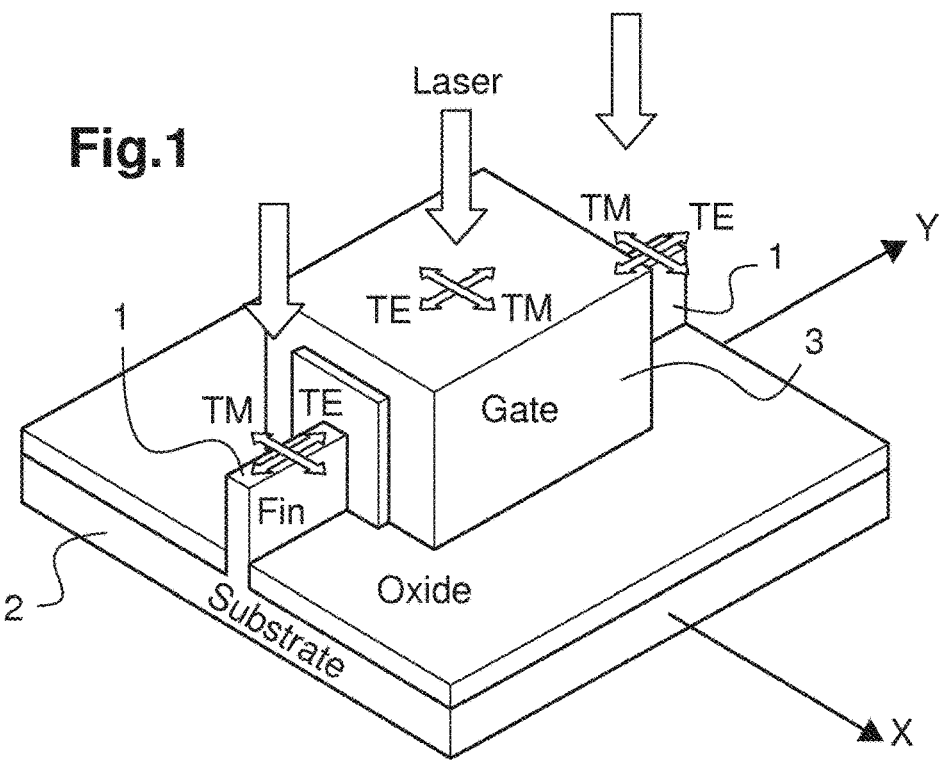

As shown in FIG. 1, a typical silicon fin-like structure 1 representative of 16 nm node technology is irradiated by a pulse laser with UV laser light at 308 nm wavelength and a pulse duration of 160 ns.

More specifically, FIG. 1 shows a field effect transistor with fin-like structures 1 up standing from the upper face of the substrate 2 (typically a silicon substrate). Also formed on the upper face of the substrate 2 is a gate 3.

Figure 2:
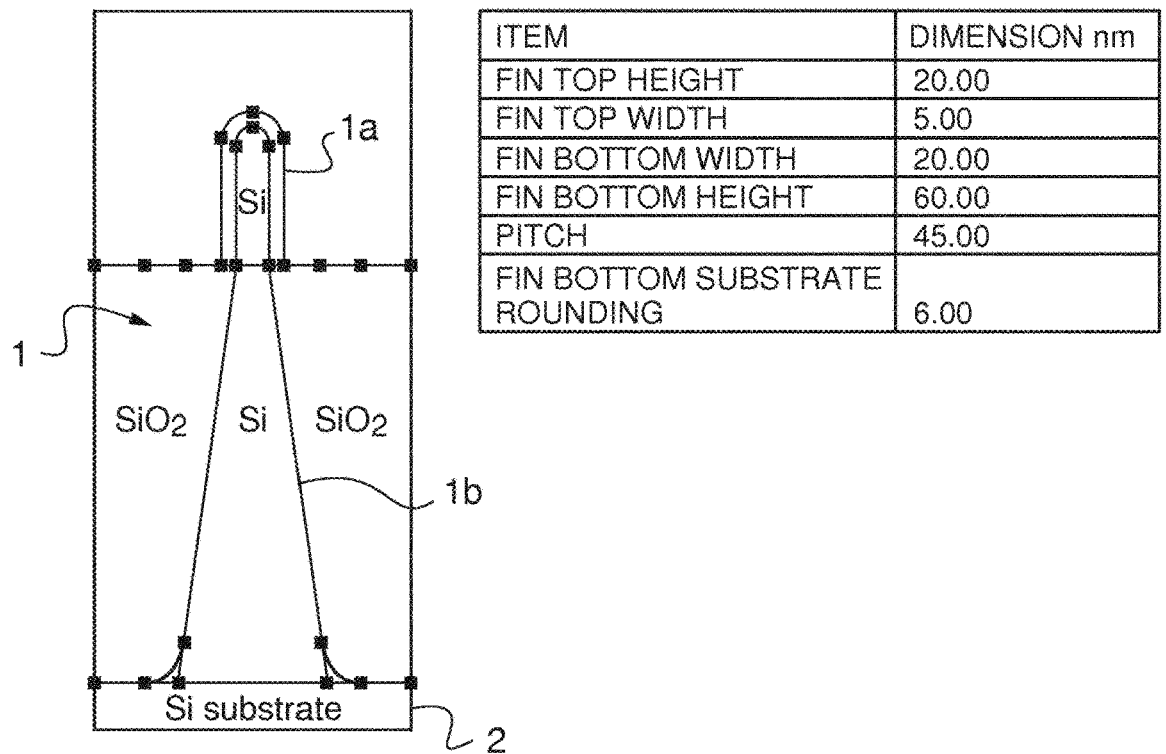
FIG. 2 is a simulated two-dimensional cross-section representation of a fin-like structure of the invention.

FIG. 2 is a simulated cross-sectional schematic representation of a fin-like structure 1 according to the invention. As shown in FIG. 2, the fin-like structure 1 extends vertically from the substrate 2 and comprises an unburied portion 1a (fin top) and a buried portion 1b (fin bottom).

The height of the fin top 1a usually ranges from 20 to 60 nm and is typically about 40 nm and the width of the fin top usually ranges from 5 to 20 nm and is typically about 5 nm.

The height of the fin bottom 1b usually ranges from 30 to 100 nm and is typically about 60 nm and the width of the fin bottom 1b (at the interface with the substrate) ranges from 10 to 80 nm and is usually about 20 nm.

The pitch of the fin-like structures usually ranges from 10 to 300 nm, for example 45 nm, 135 nm, 270 nm. The pitch for fin-like structure of FIG. 2 is 45 nm.

The electromagnetic interaction of laser light with the structure is simulated using finite element calculations.

Short (45 nm) and long (135, 270 nm) fin-to-fin period (or pitch) are considered.

In the full transverse magnetic case (TM, with light polarized perpendicularly to the fin longest dimension) the coupling occurs at fin bottom corners and the interface with the substrate. It should be noted that a significant part of the coupling occurs in the rounded bottom corners of the fin/substrate interface.

In the full transverse electric case (TE, with light polarized parallel to the fin longest dimension) the coupling occurs essentially in fin region. Some additional coupling can be seen in the substrate for large pitch values closer to the wavelength (here 270 nm).

In the depolarized case (50% TE+50% TM), the strongest contribution to coupling is from TE mode in the top fin region. The distribution is more uniform (fin vs. substrate) for the long pitch case, but the dominant coupling is always in the fin top region.

From a thermal perspective, the maximum temperature distribution can be controlled through polarization. Using TM mode, the temperature difference from fin top to bottom is almost negligible (<20° C.) while using the 100% TE polarized mode, about 375° C. thermal gradient is obtained with the highest temperature region being in the fin top.

The heat diffusion dynamics are thus also controlled by polarization. In the pure TM mode the heat diffuses from the substrate/fin interface towards the fin top, thus leading to a very uniform temperature in the fin region.

In the depolarized mode (e.g. 50% TE) and full TE case, the heat diffuses from top to bottom thus leading to a stronger gradient, which may be controlled through polarization control.

In the particular case of device of FIG. 1 with a metal gate 3 running parallel to the active fin-like structure 1, such polarization control can be used to locally generate the heat in the fin-like structure 1 using the pure TE mode. The gate 3 being oriented perpendicularly to this direction, it would only see the TE mode and will therefore be only indirectly heated by the laser light (by diffusion).

In the particular case where the gate is not present and the fin bottom 1b is a low temperature material (i.e. with a lower damage temperature or useful temperature than the fin top 1a, for example SiGe vs. Si), using the pure TM mode, the fin bottom 1b can be selectively heated or adversely, using the TE mode, less heated.

Figure 3:
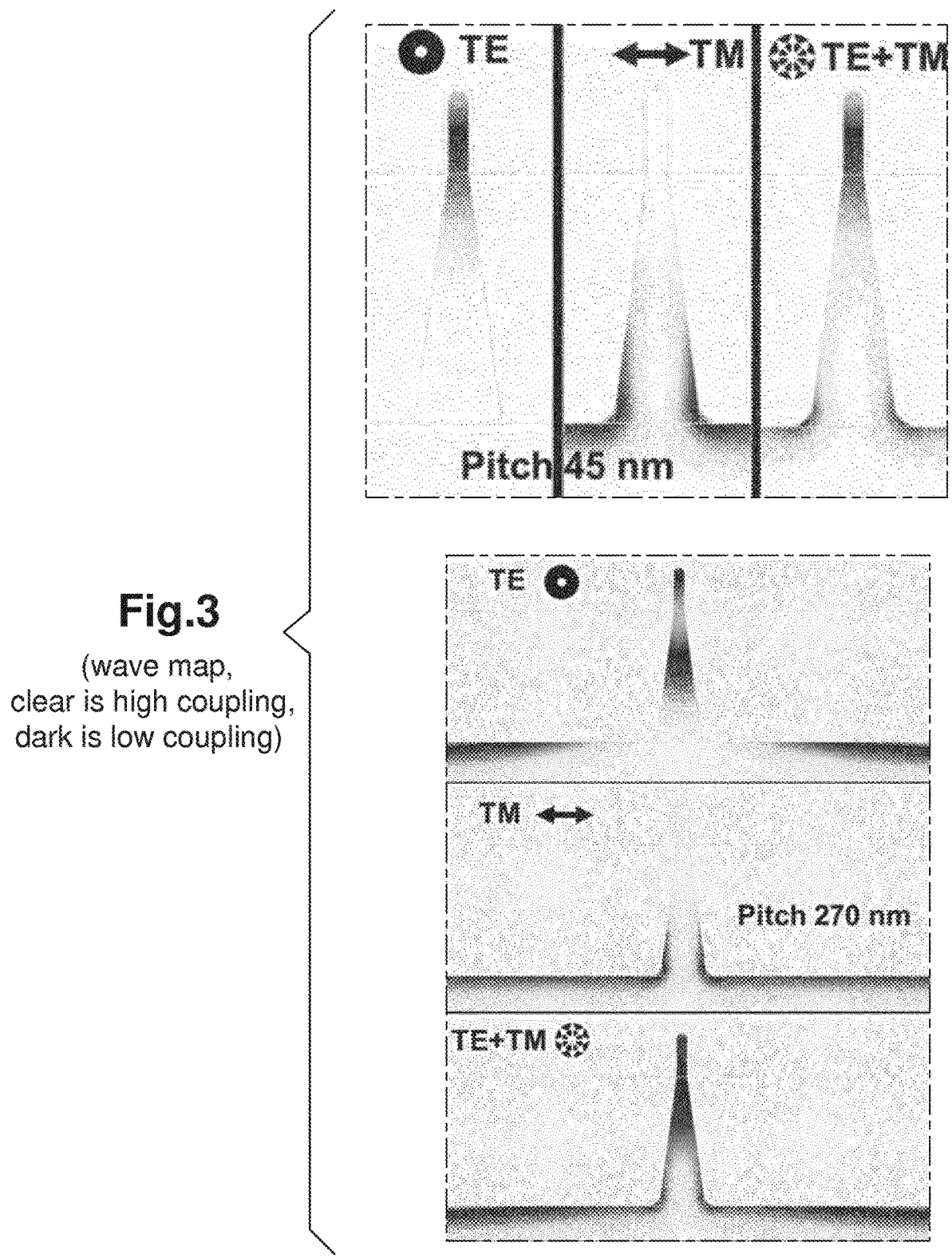
FIG. 3 is a representation of the heat distribution (W/m3) in a simulated fin-like structure of FIG. 2 when irradiated by pulsed UV laser beam of different polarizations.

Thus with reference to FIG. 3, it can be seen that by controlling the light polarization, high and low couplings can be obtained in either the fin top 1a or the fin bottom 1b, in particular at and/or near the interface with the substrate 2.

Figure 4:
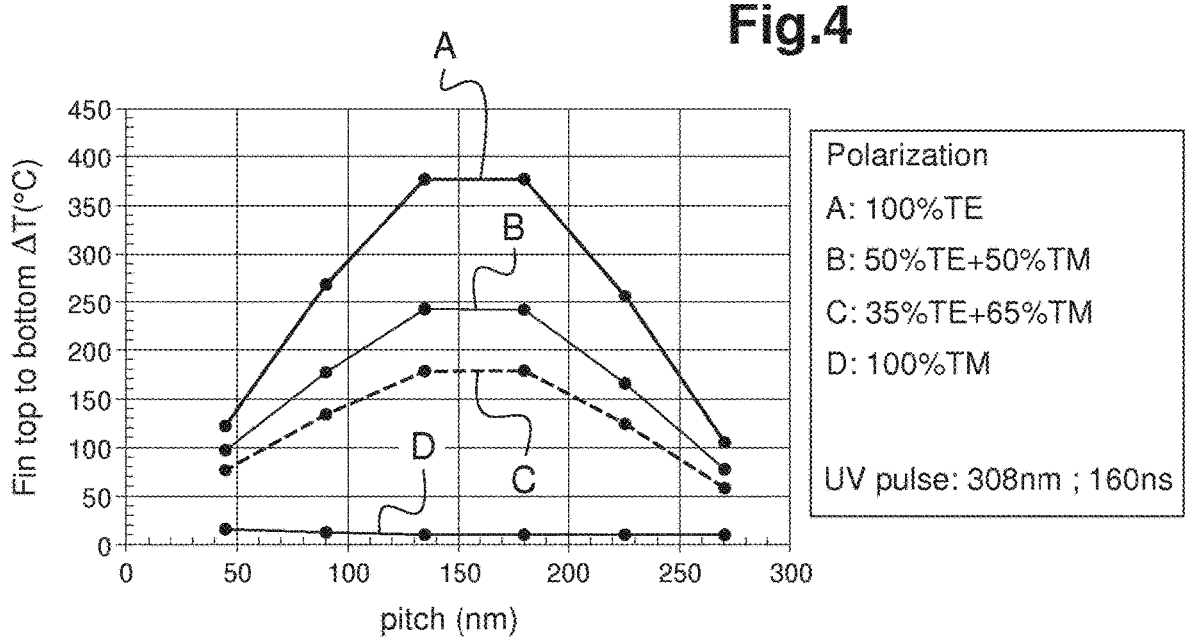
FIG. 4 are graphs of the thermal gradient from top to bottom (interface with substrate) of fin-like structure as a function of the pitch of the periodic array and for different states of polarization of the UV pulsed laser beam: curve A 100% TE mode, curve B 50% TE mode+50% TM mode, curve C 35% TE mode+65% TM mode, and curve D 100% TM mode.
Figure 5:
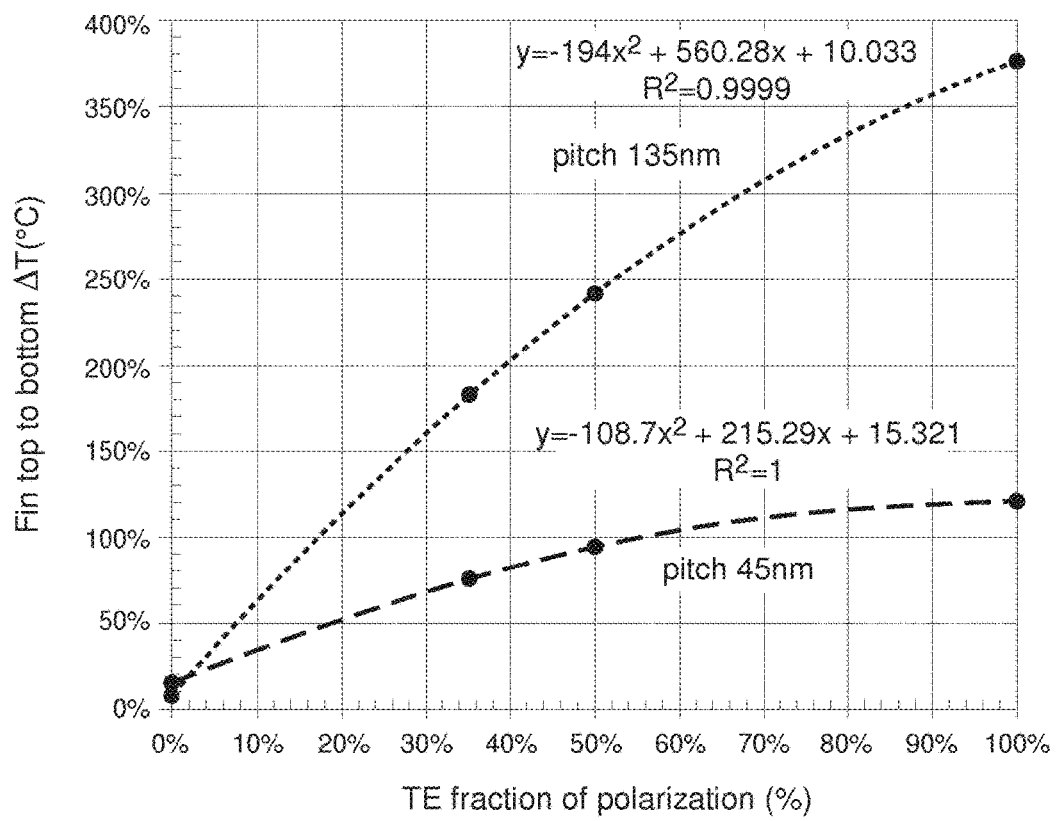
FIG. 5 are graphs of the thermal gradient from top to bottom (interface with substrate) of fin-like structure as a function of TE mode fraction of polarization (%)
Figure 6:
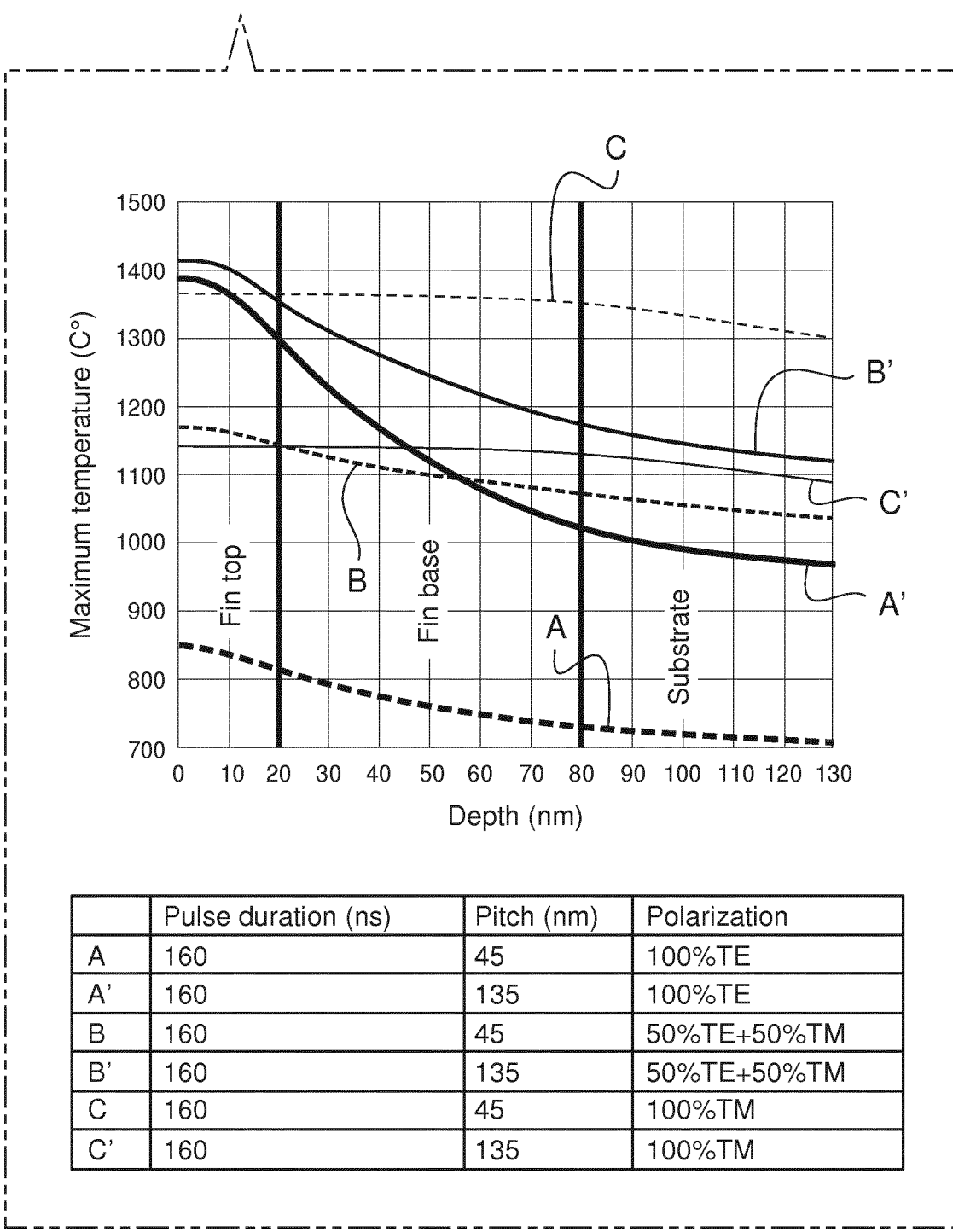
FIG. 6 are graphs of the temperature profiles in center of a fin-like structure for different polarization. Temperature is the maximum reached at any time during the annealing process.

FIGS. 4, 5 and 6 show how heating is controlled within the fin-like structures of FIG. 2 using different polarization of the pulse UV laser beam for different pitches of the fin-like structure.

Figure 7:
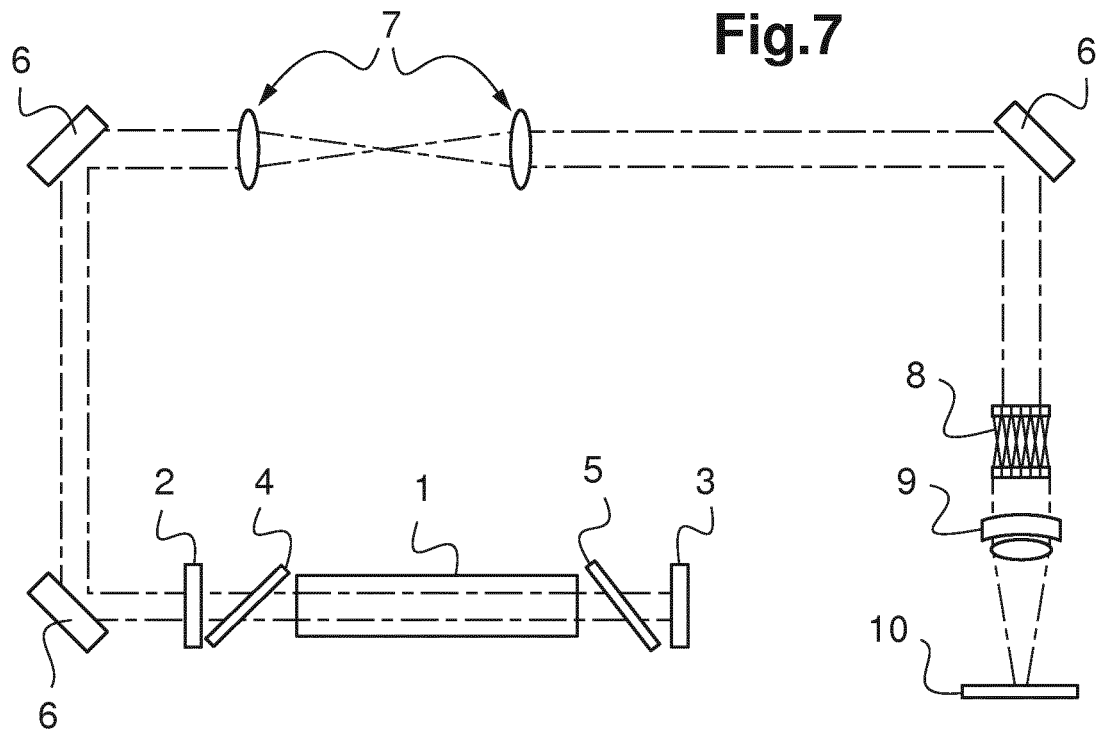
FIG. 7 is a schematic representation of an embodiment of a laser module with control of polarization of the laser beam.

FIG. 7 is a schematic representation of an embodiment of a laser with control of polarization of the laser beam.

A Xenon-Chloride Excimer laser emitting at 308 nm comprises:
an excimer gain generator 1;
an optical resonator on both ends of the gain generator formed of two plane mirrors: a partial reflector 2, with reflectivity of ~between 4 to 60% (typically 25%) and a high reflector 3 of reflectivity ~100%;
two polarizing plates 4 and 5 positioned between the gain generator and mirrors 2 and 3 respectively. Those plates are coated so that they exhibit a much larger transmission coefficient for one polarization (e.g. Transmission(TM) ≥70%) than the other (e.g. Transmission(TE)≤20%).

As light is oscillating between the two resonator mirrors 2 and 3, the much larger transmission of the plates 4 and 5 for TM polarization will force the resulting laser pulse to be mostly polarized linearly along TM.

The polarization purity (i.e. how close to perfectly linearly polarized the laser beam is) will depend on the exact transmission of the plates 4 and 5 for the unwanted polarization (TE in this case) and the average number of round trips of the light in the resonator (which itself depends on the gain duration and the reflectivity of output mirror 2). For example, increasing output mirror reflectivity 2 will increase the number of round trip, improving the polarization selectivity (but at the expense of total output energy)

The laser beam is then transported by mirrors 6 and beam transfer lenses 7, homogenized by micro lens arrays 8 and projected by a lens system 9 to form a uniform illumination area on the surface of the semiconductor 10. Additionally, laser energy and magnification of the optical system can be selected to form an illumination area that matches the size and shape of the semiconductor device.

Polarization of the laser can be adjusted by several means to respond to the specific annealing requirements described in the previous section:
to select mostly linearly TM polarized beam: insert plates 4 and 5 with maximum difference between TE & TM transmission;
to select mostly linearly TE polarized beam: rotate plates 4 and 5 by 90° around the laser beam axis (it is interesting to note that an alternate easy way to switch from a linear TM to a linear TE configuration is to rotate the semiconductor substrate by 90° to change the orientation of the fin-like structure with respect to the dominating linear polarization);
to select a 50/50 polarization ratio (i.e. "unpolarized beam"), remove plates 4 and 5 as a typical excimer laser will naturally exhibit such a polarization state;
to select a polarization ratio intermediate between the unpolarized state (50/50) and the perfectly linear state (TE or TM), one can change the incident angle of the plates 4 and 5 or select plates with transmission of TE and TM optimized (versus targeting maximum difference between TM and TE).

Figure 8:
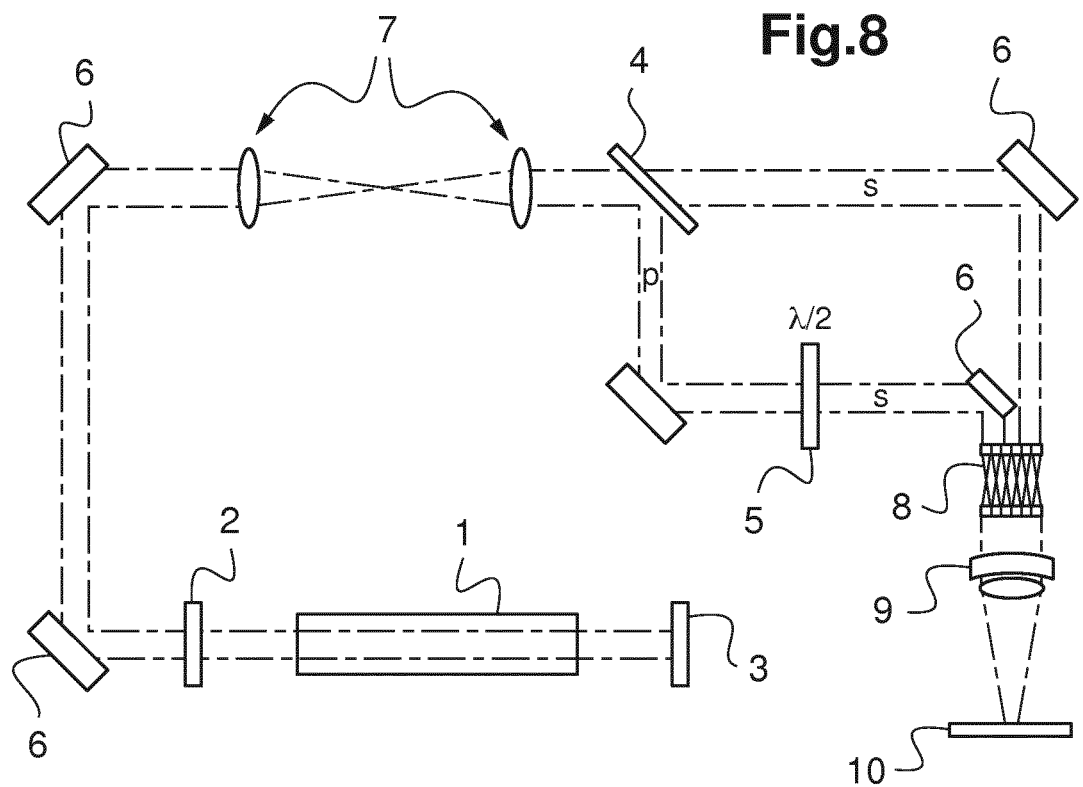
FIG. 8 is a schematic representation of another embodiment of a laser module with control of polarization of the laser beam.

FIG. 8 is a schematic representation of another embodiment of a laser with control of the polarization of the laser beam.

One alternative for controlling the state of polarization of the laser beam incident on the wafer is to do it after the laser resonator 1 in such way that laser energy is not lost in the polarizing process.

One way to achieve this is shown in the FIG. 8. In this case, a polarizer 4 can separate polarization components s and p into two distinct sub-beams, and a half-wave ($\lambda/2$) plate 5 can rotate polarization of one of the sub-beam (p in the example of FIG. 8) so that to end up with two sub-beams of identical polarization (s in the example of FIG. 8).

The two sub beams can then be recombined in the optical system. One convenient way to do it is to use the beam homogenizer 8. This will result in a perfectly polarized beam (s or p) incident on the wafer 10.

For a state of polarization controlled between the extreme cases 100% s or 100% p, the half-wave plate 4 can be replaced by variable attenuators to control the ratio s and p that will be combined in the beam homogenizer 8.

The invention claimed is:

1. Method of laser irradiation of a patterned semiconductor device comprising a periodic array of sub-wavelength fin-like structures, all fin-like structures upstanding from a base face of said semiconductor device and defining an upper face of said periodic array opposite to said base face, each fin-like structure having:
   a width along a first direction parallel to said base face, said width being of the order of magnitude or smaller than the laser wavelength;
   a length along a second direction parallel to said base face and perpendicular to said first direction, said length being at least 3 times greater than said width; and
   a height along a third direction perpendicular to said base face,
   said method of laser irradiation comprising the steps of:
   generating a UV pulsed laser beam by means of a laser module;
   irradiating at least a portion of said upper face of the periodic array of fin-like structures with said laser beam,
   wherein the method further comprises imparting a controlled state of polarization to said laser beam so as to selectively control the amount of energy of the laser beam coupled locally to each fin-like structure along the third direction.

2. The method of laser irradiation according to claim 1, wherein said controlled state of polarization imparted to the laser beam is determined so as to further control a gradient of heat diffusion along the third direction, in amplitude and/or direction, within each fin-like structure.

3. The method of laser irradiation according to claim 2, wherein said controlled state of polarization imparted to the laser beam is determined according to a pitch of said periodic array of fin-like structures.

4. The method of laser irradiation according to claim 1, wherein said controlled state of polarization imparted to the laser beam is determined according to a pitch of said periodic array of fin-like structures.

5. The method of laser irradiation according to claim 1, wherein said controlled state of polarization imparted to the laser beam is determined according to an angle of incidence of said laser beam onto said upper face of the periodic array.

6. The method of laser irradiation according to claim 1, wherein said controlled state of polarization imparted to the laser beam is linear, circular, elliptical, unpolarized, or a combination thereof.

7. The method of laser irradiation according to claim 1, wherein, said laser beam being irradiated perpendicularly to the upper face of the periodic array, the controlled state of polarization imparted to the laser beam comprises a first linear polarization along the first direction.

8. The method of laser irradiation according to claim 1, wherein, said laser beam being irradiated perpendicularly to the upper face of the periodic array, the controlled state of polarization imparted to the laser beam comprises a second linear polarization along the second direction.

9. The method of laser irradiation according to claim 1, wherein imparting said controlled state of polarization comprises inserting at least one polarizing element into a laser cavity of said laser module.

10. The method of laser irradiation according to claim 9, wherein:
- a first polarizing plate is inserted into said laser cavity, between a laser amplifier and a nearly perfect mirror of the laser module;
- a second polarizing plate is inserted into said laser cavity, opposite to said first polarizing plate with respect to the laser amplifier, between said laser amplifier and an output mirror of the laser module; and wherein imparting said controlled state of polarization further comprises adjusting, at a wavelength of the laser cavity, transmission properties of said first and second plates with respect to two orthogonal polarized modes oscillating inside the cavity.

11. The method of laser irradiation according to claim 1, further comprising a step of homogenizing said laser beam before irradiation so as to irradiate said semiconductor device with a homogeneous laser fluence.

12. The method of laser irradiation according to claim 1, further comprising a step of shaping said laser beam so as to form an irradiation area matching the size and/or the shape of the overall semiconductor device.

13. The method of laser irradiation according to claim 1, wherein the UV pulsed laser beam has a pulse duration below 200 nanoseconds.

14. The method of laser irradiation according to claim 1, wherein the UV pulsed laser beam has a UV wavelength below 355 nanometers.

15. The method of laser irradiation according to claim 1, wherein the laser module is an excimer laser module.

16. The method of laser irradiation according to claim 1, wherein a fluence of the laser beam on the upper face of the periodic array is greater than 1 Joule per square meter.

17. The method of claim 1, wherein the length is at least 5 times greater than said width.

18. The method of claim 1, wherein the length is at least 10 times greater than said width.

19. The method of laser irradiation according to claim 1, wherein the laser module is a xenon-chloride laser module.

20. The method of laser irradiation according to claim 1, wherein the UV pulsed laser beam has a UV wavelength at 308 nm.

* * * * *